United States Patent
Marchand et al.

(10) Patent No.: US 6,498,293 B2
(45) Date of Patent: Dec. 24, 2002

(54) OPEN ENDED, ROLLED EDGE THROUGH PASSAGEWAY FOR ROUTING CABLE

(75) Inventors: Valerie A. Marchand, Westerly, RI (US); Rudolph A. Montgelas, West Hartford, CT (US); Cynthia K. Tulacro, Wolcott, CT (US); Jon A. Lutzen, Manchester, CT (US)

(73) Assignee: Hubbell Incorporated, Orange, CT (US)

( * ) Notice: Subject to any disclaimer, the term of this patent is extended or adjusted under 35 U.S.C. 154(b) by 0 days.

(21) Appl. No.: 09/813,282

(22) Filed: Mar. 21, 2001

(65) Prior Publication Data

US 2002/0134566 A1 Sep. 26, 2002

(51) Int. Cl.⁷ ................................................ H02G 3/08
(52) U.S. Cl. .............................. 174/50; 174/58; 174/63; 220/4.02; 248/906
(58) Field of Search .............................. 174/50, 58, 63, 174/17 R, 60, 64, DIG. 9; 220/4.02, 3.6, 3.8; 248/906; 439/535; 33/528, DIG. 10

(56) References Cited

U.S. PATENT DOCUMENTS

| | | | |
|---|---|---|---|
| 5,052,773 A | 10/1991 | Noon et al. ................. 385/136 |
| 5,408,570 A | 4/1995 | Cook et al. ................. 385/134 |
| 5,459,808 A | 10/1995 | Keith ......................... 385/135 |
| 5,546,495 A | * 8/1996 | Bruckner et al. ........... 385/135 |
| 5,559,922 A | 9/1996 | Arnett ........................ 385/135 |
| 5,737,475 A | * 4/1998 | Regester ..................... 385/134 |
| 5,898,129 A | * 4/1999 | Ott et al. ...................... 174/59 |
| 5,922,997 A | 7/1999 | Lecinski ..................... 174/135 |
| 5,933,563 A | * 8/1999 | Schaffer et al. ............. 385/135 |
| 6,081,419 A | * 6/2000 | Pham ......................... 361/617 |
| 6,147,304 A | * 11/2000 | Doherty ....................... 174/48 |
| 6,184,467 B1 | * 2/2001 | Milanowski et al. ........ 174/659 |
| 6,215,064 B1 | * 4/2001 | Noble et al. .................. 174/59 |
| 6,232,553 B1 | * 5/2001 | Regen ........................... 174/64 |

* cited by examiner

*Primary Examiner*—Anthony Dinkins
*Assistant Examiner*—Dhiru R Patel
(74) *Attorney, Agent, or Firm*—Mark S. Bicks; Jeffrey J. Howell; Alfred N. Goodman

(57) ABSTRACT

An enclosure for an electrical device includes a first wall portion. The first wall portion has a first cable through passageway with an edge, a portion of the edge being rolled. A second wall portion is adjacent the first wall portion and has a removable knock-out portion at least partially covering a second cable through passageway.

63 Claims, 7 Drawing Sheets

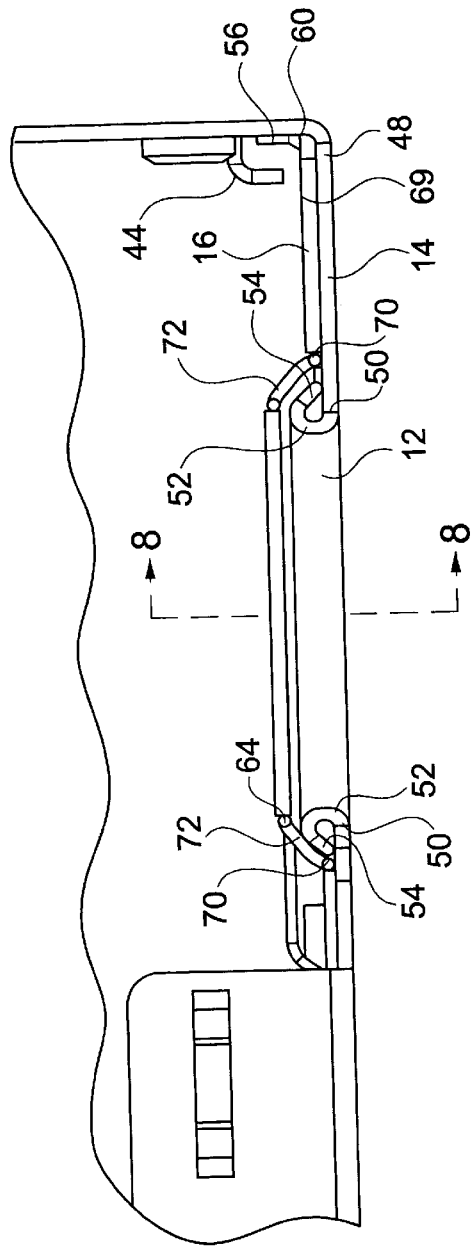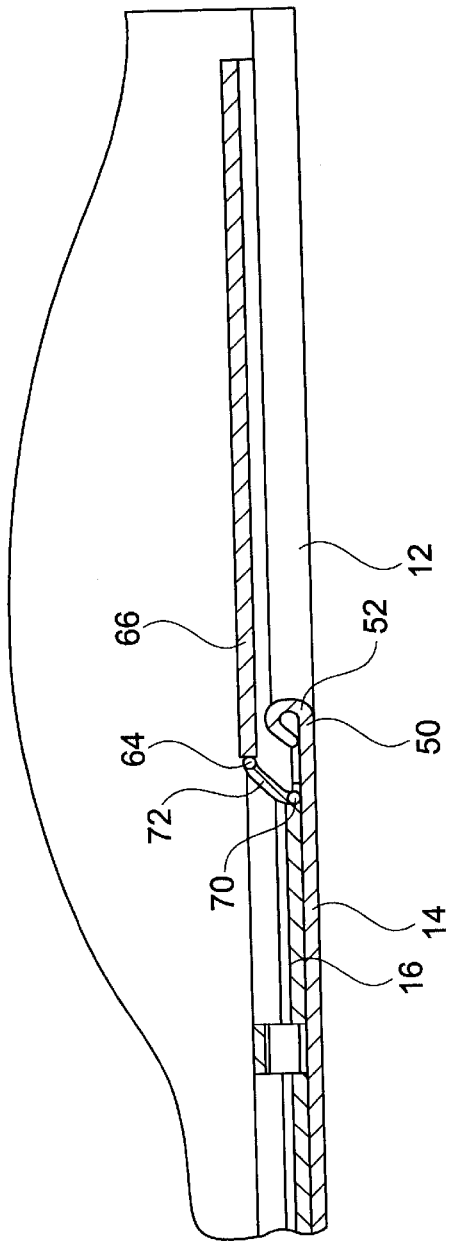

OPEN ENDED, ROLLED EDGE THROUGH PASSAGEWAY FOR ROUTING CABLE

FIELD OF THE INVENTION

The present invention relates to an enclosure for an electrical device that has a through passageway for routing cables. More particularly, the present invention relates to an enclosure for an electrical device including a wall portion having a through passageway with a rolled edge for routing cables. A movable tray overlies the wall portion and has a removable knock-out portion that substantially aligns with the through passageway.

BACKGROUND OF THE INVENTION

Conventional enclosures for electrical devices are generally used to help transmit voice and data communications, which are transmitted through electric wires, fiber optic cables with a plurality of fiber optic strands, coaxial cables, or microwave systems. Fiber optic lines are becoming the most desirable transmission medium because they have a larger transmission capacity than other transmission media. Thus, to handle the large volume of voice and data communications in many applications, commercial carriers that operate wide area networks and businesses using internal networks often install fiber optic cables.

In a typical application, a telecommunication company or other commercial carrier connects one or more fiber optic cables to an enclosure unit or electrical box. Each fiber optic cable generally has a plurality of fiber optic strands; and each fiber optic strand is generally connected to a separate connector in the enclosure unit. The connectors of the enclosure units are also coupled to internal lines routed to adapters, jacks or other types of connectors at specific locations within a building. Enclosure units are usually wall or rack mounted. To maximize the number of enclosure units that can fit in the limited space of a typical communications room, a number of enclosure units are preferably mounted in a single rack.

With a typical rack-mount enclosure unit, a number of connection units are vertically mounted in the rack. The fiber optic cables or individual fiber optic strands typically pass from one enclosure unit to the next by being fed or threaded into cable passageways in the sides, tops and/or bottoms in the enclosure units.

Conventional rack-mount and wall-mount enclosure units have several limitations. Generally, when threading or passing cables through the cable passageways, the cables can be chafed, cut or damaged by the edge of the passageway in the metal enclosure unit. Additionally, when the conventional cable through passageways are not in use, dust, dirt or other debris may enter through the cable passageway into the enclosure unit damaging any electrical wiring, connectors or other electrical devices inside. Some conventional enclosure units may attempt to avoid this problem by passing the cables through grommets, gaskets or other rubber barriers. However, this makes the installation more difficult and time consuming, since it is usually necessary to cut holes in the gasket and then feed the cable through a relatively small hole in the gasket.

Examples of conventional through passageways for routing cable are disclosed in the following U.S. Pat. No. 5,933,563 to Schaffer et al.; U.S. Pat. No. 5,922,997 to Lecinski; U.S. Pat. No. 5,559,922 to Arnett; U.S. Pat. No. 5,459,808 to Keith; U.S. Pat. No. 5,408,570 to Cook et al.; and U.S. Pat. No. 5,052,773 to Noon et al.

SUMMARY OF THE INVENTION

Accordingly, an object of the present invention is to provide an improved enclosure for an electrical device having a cable through passageway.

Another object of the present invention is to provide an enclosure for an electrical device that allows cables to be installed therein in an easy and time efficient manner.

Still another object of the present invention is to provide an enclosure for an electrical device with a cable through passageway that eliminates or reduces chafing, cutting or damaging of cables passed therethrough.

Yet another object of the present invention is to provide an enclosure for an electrical device that has a cable through passageway that can be easily covered to protect the interior of the enclosure or uncovered to allow passage of a cable therethrough.

The foregoing objects are basically obtained by providing an enclosure for an electrical device including a first wall portion with a first cable through passageway having an edge, a portion of the edge being rolled. A second wall portion is adjacent the first portion and has a removable knock-out portion at least partially covering a second cable through passageway.

By forming an enclosure for an electrical device according to the present invention, a cable can be passed through the cable passageway easily, quickly and without chafing or damaging the cable. Additionally, the cable passageway can be easily covered to protect the interior of the enclosure unit from dust, dirt or other debris.

Other objects, advantages and salient features of the invention will become apparent from the following detailed description which, taken in conjunction with the annexed drawings, discloses a preferred embodiment of the invention.

BRIEF DESCRIPTION OF THE DRAWINGS

Referring to the drawings which form a part of this disclosure:

FIG. 7 is an enlarged, partial end elevational view of the enclosure of FIG. 4.

FIG. 8 is a side-elevational view in section taken along lines 8—8 of FIG. 7.

DETAILED DESCRIPTION OF THE INVENTION

Figure 1:
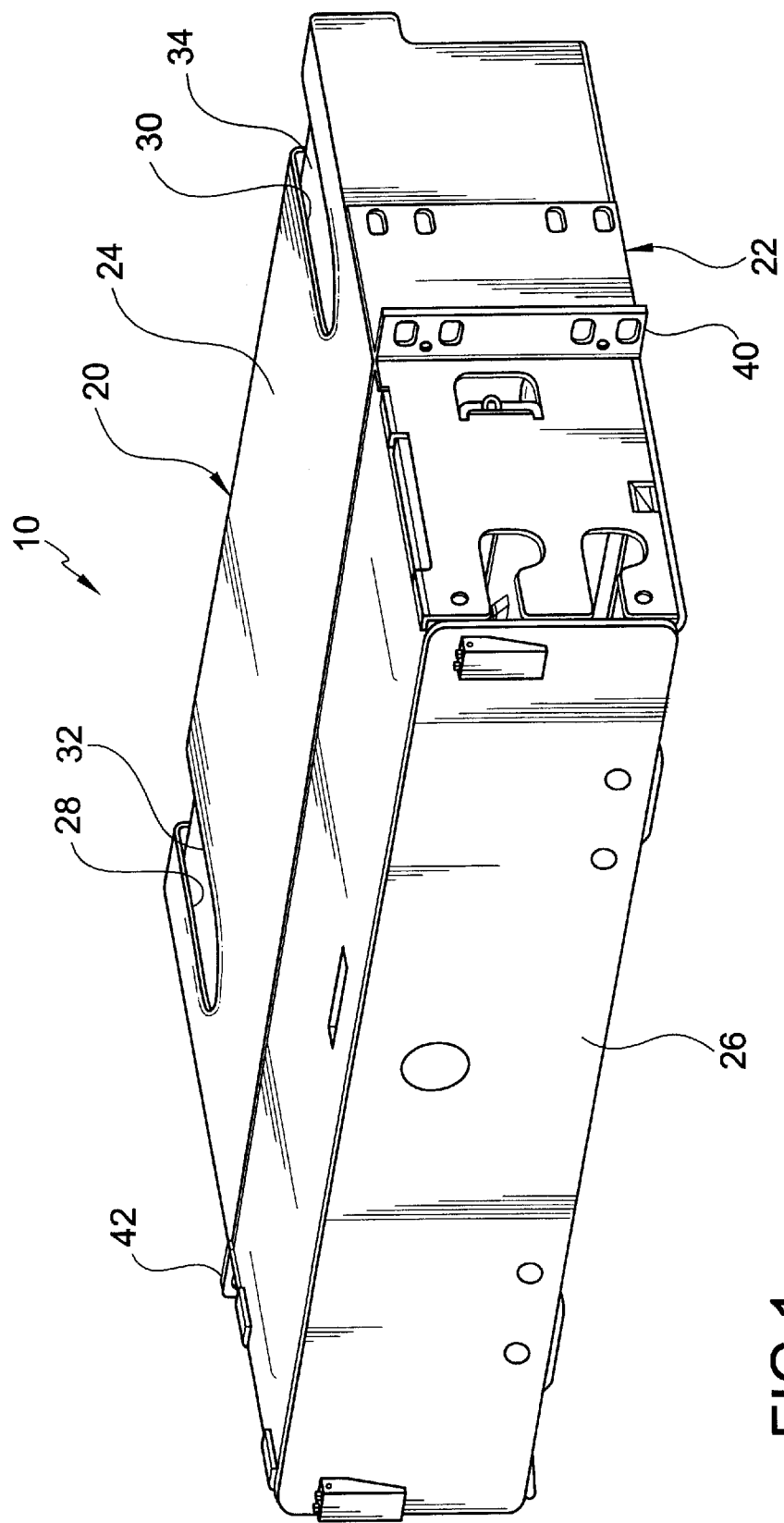
FIG. 1 is a top perspective view of an enclosure for an electrical device according to the present invention.
Figure 2:
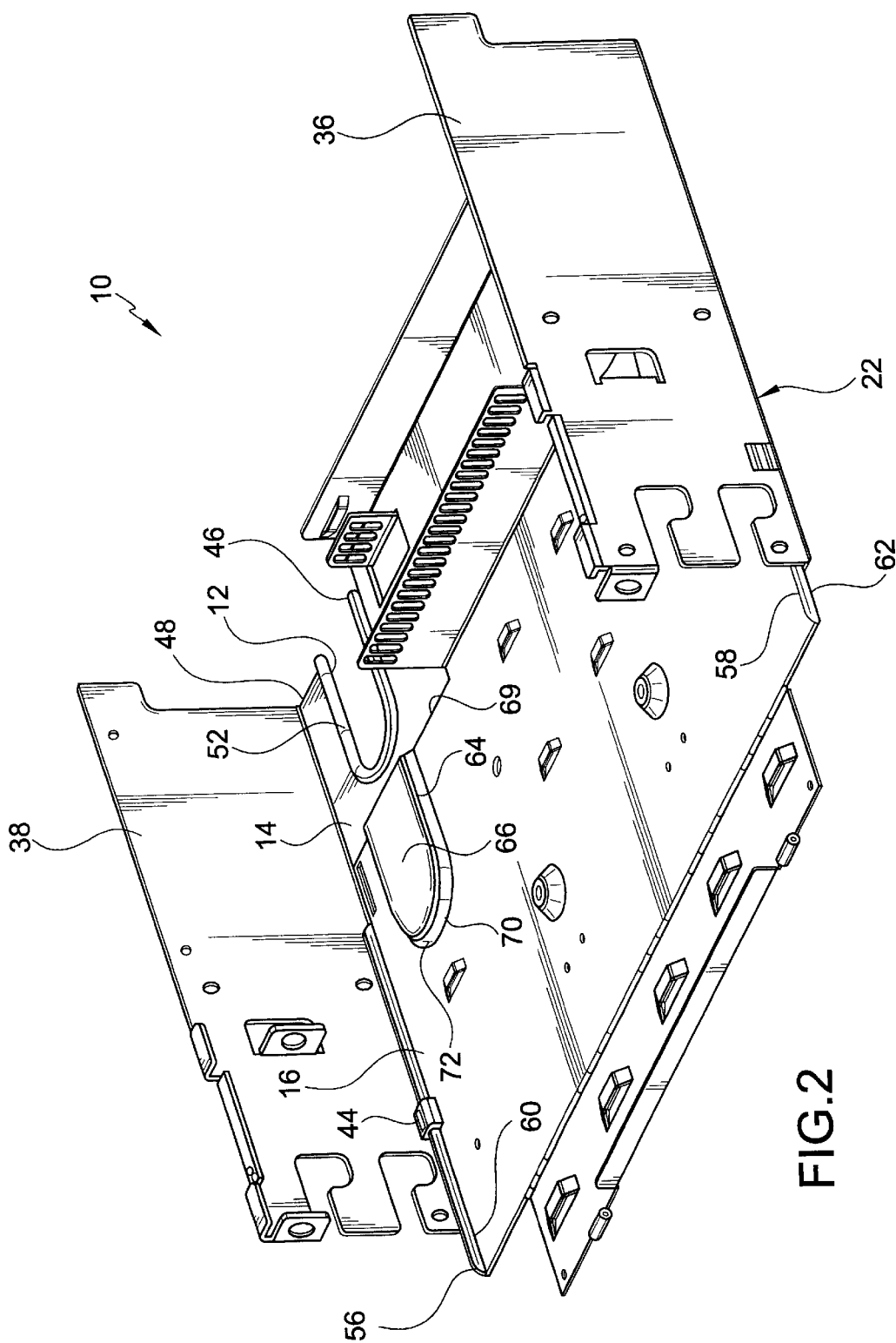
FIG. 2 is top perspective view of the enclosure of FIG. 1 with a top portion removed and the movable wall portion shown in an open position.
Figure 6:
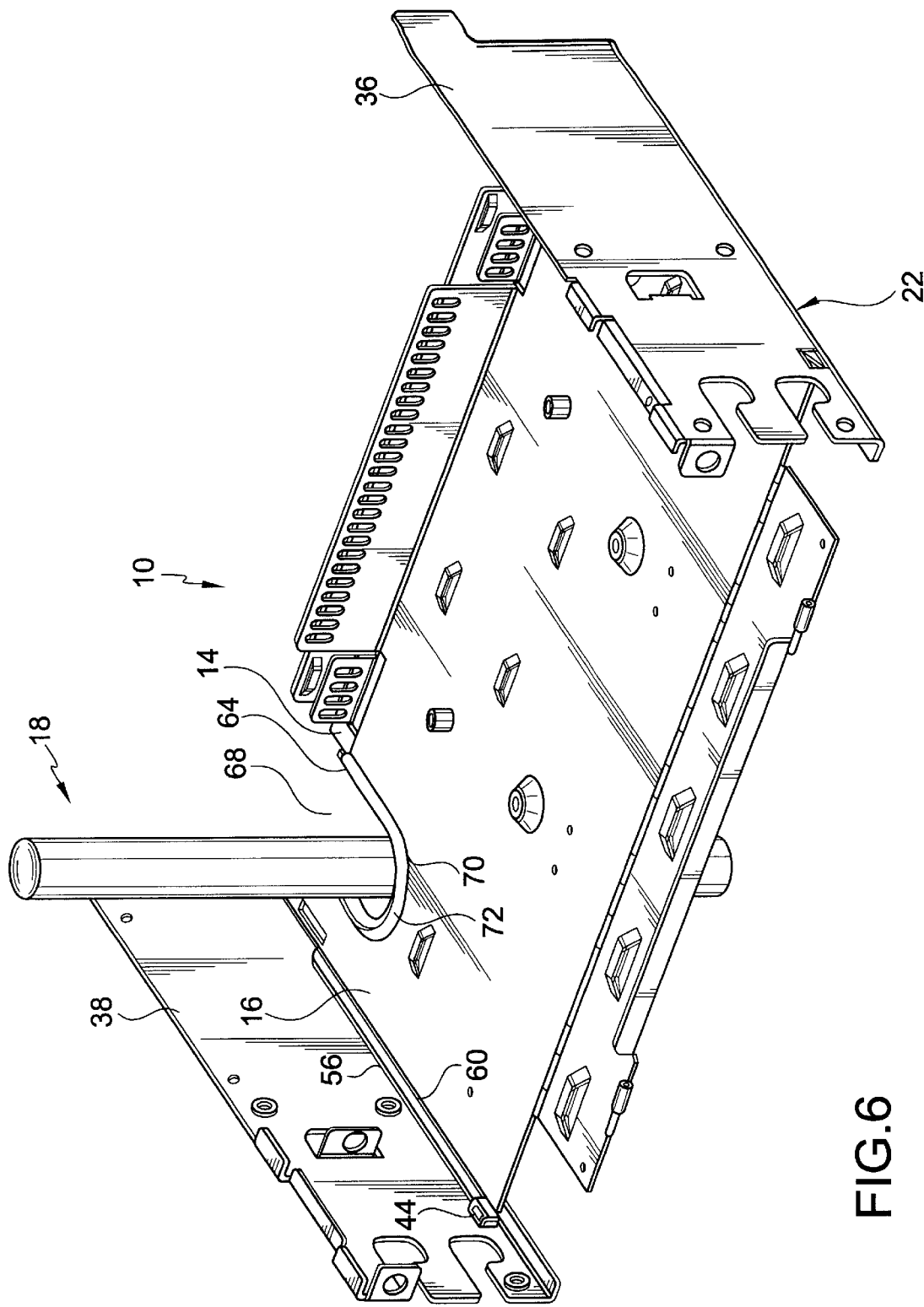
FIG. 6 is a top perspective view of the enclosure of FIG. 5 with a cable extending through the cable through passageway.

Referring initially to FIGS. 1, 2 and 6, enclosure 10 for an electrical device according to the preferred embodiment of the present invention is shown. Enclosure 10 is preferably a substantially rectangular metal box and is preferably formed from a two-piece housing having a top portion 20 and a bottom portion 22 that are capable of having electrical wiring or cable 18 pass thereinto. Additionally, enclosure 10 is preferably capable of being coupled to or mounted in a rack, allowing stacking of multiple enclosures for efficiency of space. However, enclosure 10 can be any type of enclosure desired, be made from any material desired and be any configuration as is known in the art.

Cable 18 is preferably a fiber optic cable, but may be any cable or electrical wiring desired, such as wiring for an electrical outlet, a computer, telephone, or facsimile machine. The wiring can include metallic or glass wires.

As seen in FIG. 1, top portion 20 has a top surface 24, a first end surface 26 and second end surface (not shown). Top surface 24 is preferably substantially planar and is substantially perpendicular to the first and second end surfaces. Top surface 24 also has two open-ended U-shaped through passageways 28 and 30 extending therethrough for passing cable therethrough. Each through passageway can be covered by an overlying knock-out portion 32 and 34, respectively. However, top surface 24 and its end surfaces may be may be any configuration or material, have any number of through passageways extending therethrough and the surfaces may extend at any angle relative to each other, as desired.

As seen in FIGS. 1–4, bottom portion 22 is preferably metal and has a substantially planar bottom surface or first wall portion 14, which has side surfaces or wall portions 36 and 38 extending substantially perpendicular therefrom. Each side surface 36 and 38 has a bracket 40 and 42, respectively, to allow the enclosure to couple or mount to a rack. Each side also has a bracket or track 44 (FIG. 2) for coupling to tray 16. Surface 14 has at least one cable through passageway or cable entry slot 12 extending therethrough. Preferably, surface 14 has two cable through passageways adjacent each other in approximately the same configuration as shown in FIG. 1 for top portion 20. However, surface 14 can have three or more passageways extending therethrough, can be any configuration desired, and can have any number of through passageways extending therethrough; and the surfaces may extend at any angle relative to each other, as desired.

As seen in FIGS. 7 and 8, passageway 12 is preferably U-shaped and has an opening 46 with a free end 48 at surface 14, and has an edge 50 that preferably has a rolled portion 52 extending therefrom. Edge 50 is preferably unitary with surface 14; and the rolled portion 52 extends upwardly and into the enclosure 10. Edge 50 rolls back on itself toward surface 14 and away from the through passageway 12, forming a substantially U-shaped cross-section. Free end 54 of rolled portion 52 is preferably adjacent to or contacts surface 14. However, the free end does not necessarily need to be adjacent to or touch surface 14, and may only extend so that it is substantially parallel to, perpendicular to or extends at any other suitable angle to surface 14. The rolled portion of the edge can be formed by any means known in the art and may extend along substantially all of edge 50 or along only a portion of edge 50.

As seen in FIGS. 2–5, bottom portion 22 has a metal moveable tray 16 coupled thereto by brackets 44. Movable tray or second wall portion 16 is preferably a substantially rectangular, planar metal tray that is substantially parallel to and overlies surface 14, and has at least one substantially U-shaped cable through passageway or cable entry slot 64. However, tray 16 can have two or more passageways extending therethrough, does not necessarily need to be substantially parallel to surface 14 and can be any material or configuration desired. Moveable tray 16 allows easy installation of cable 18 and can contain splice trays, extra cable looped and coupled thereto, or any other hardware known in the art.

Figure 3:
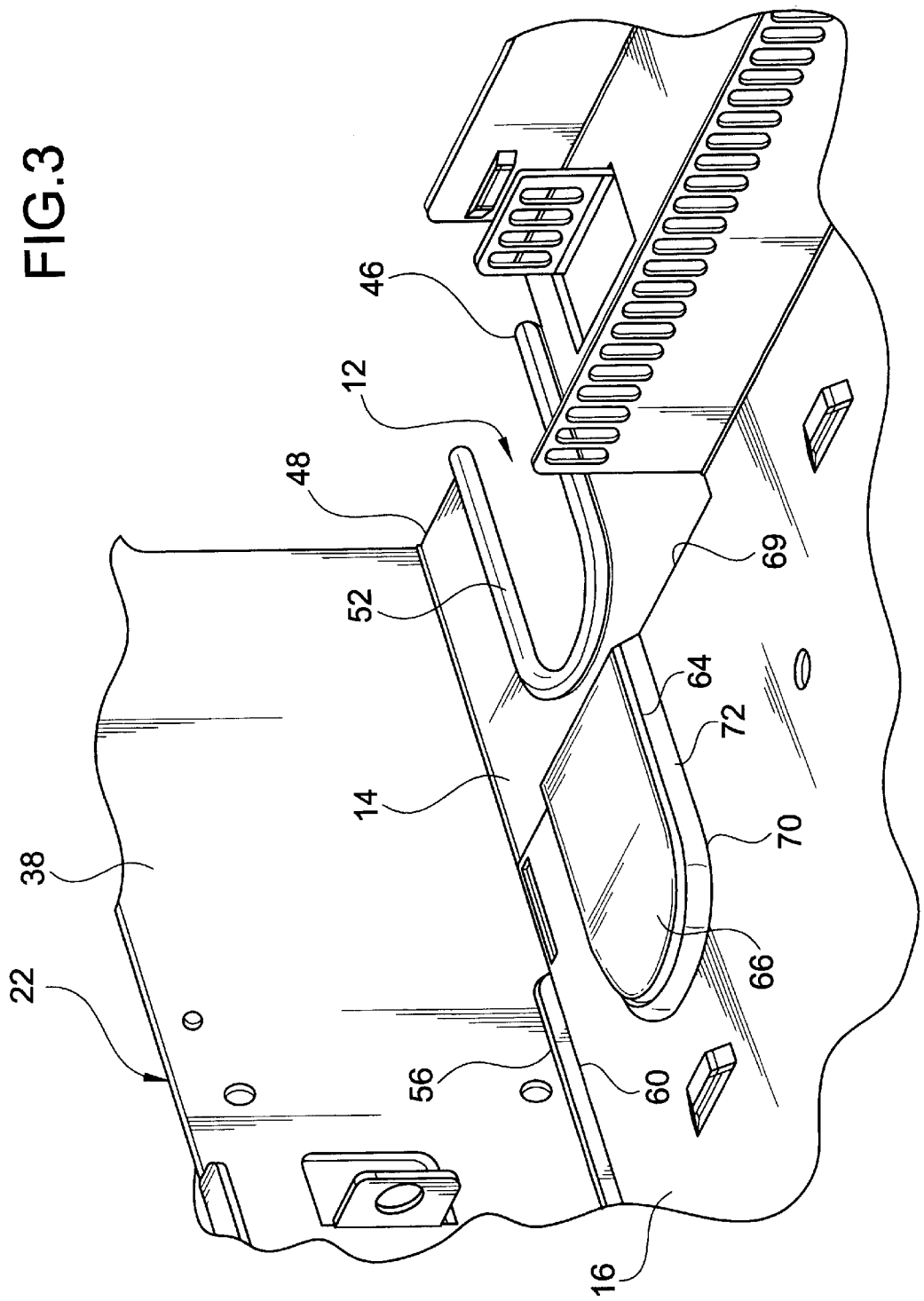
FIG. 3 is an enlarged partial top perspective view of the enclosure device of FIG. 2.
Figure 4:
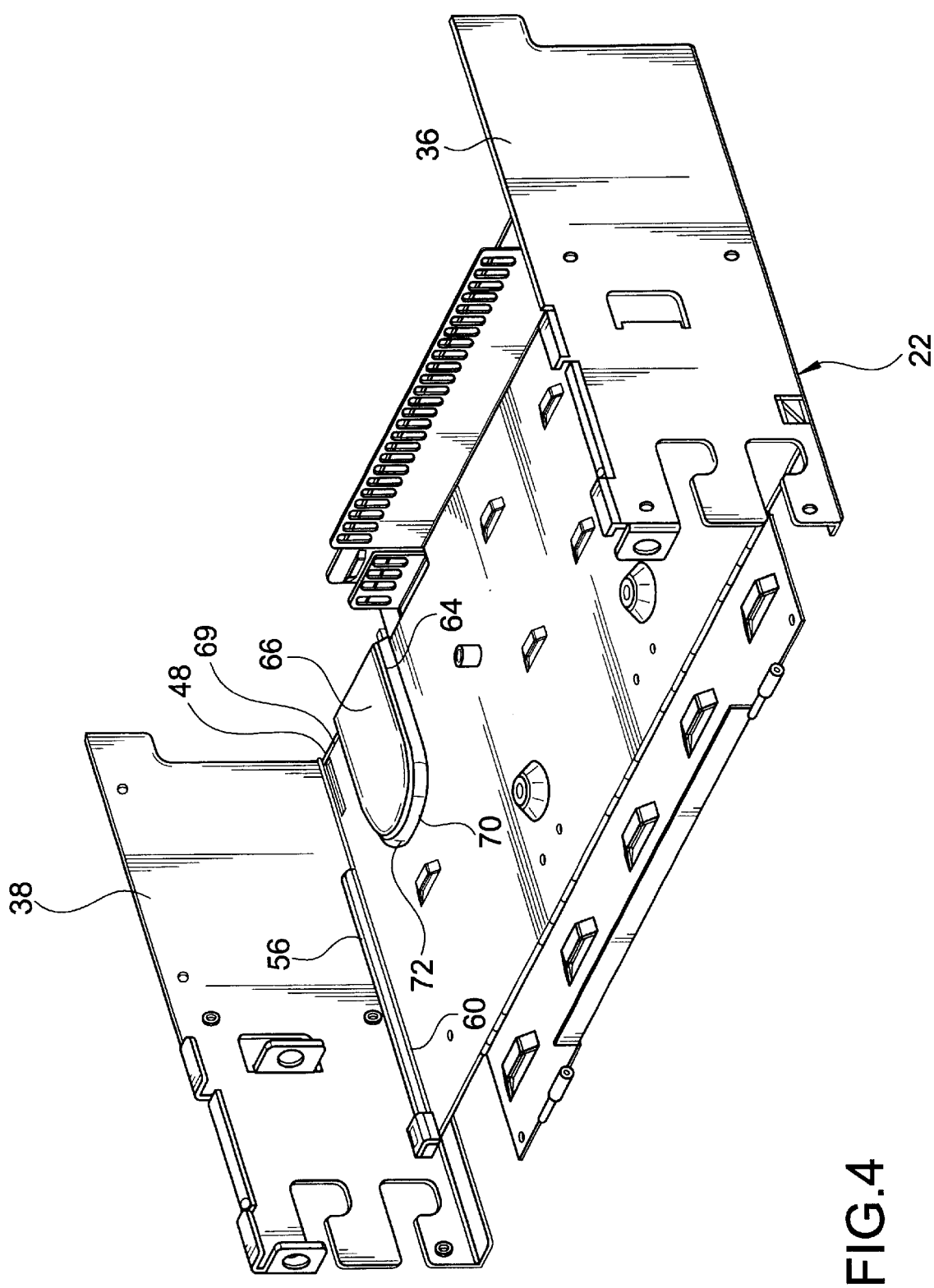
FIG. 4 is a top perspective view of the enclosure of FIG. 2 with the movable wall portion shown in the closed position.
Figure 5:
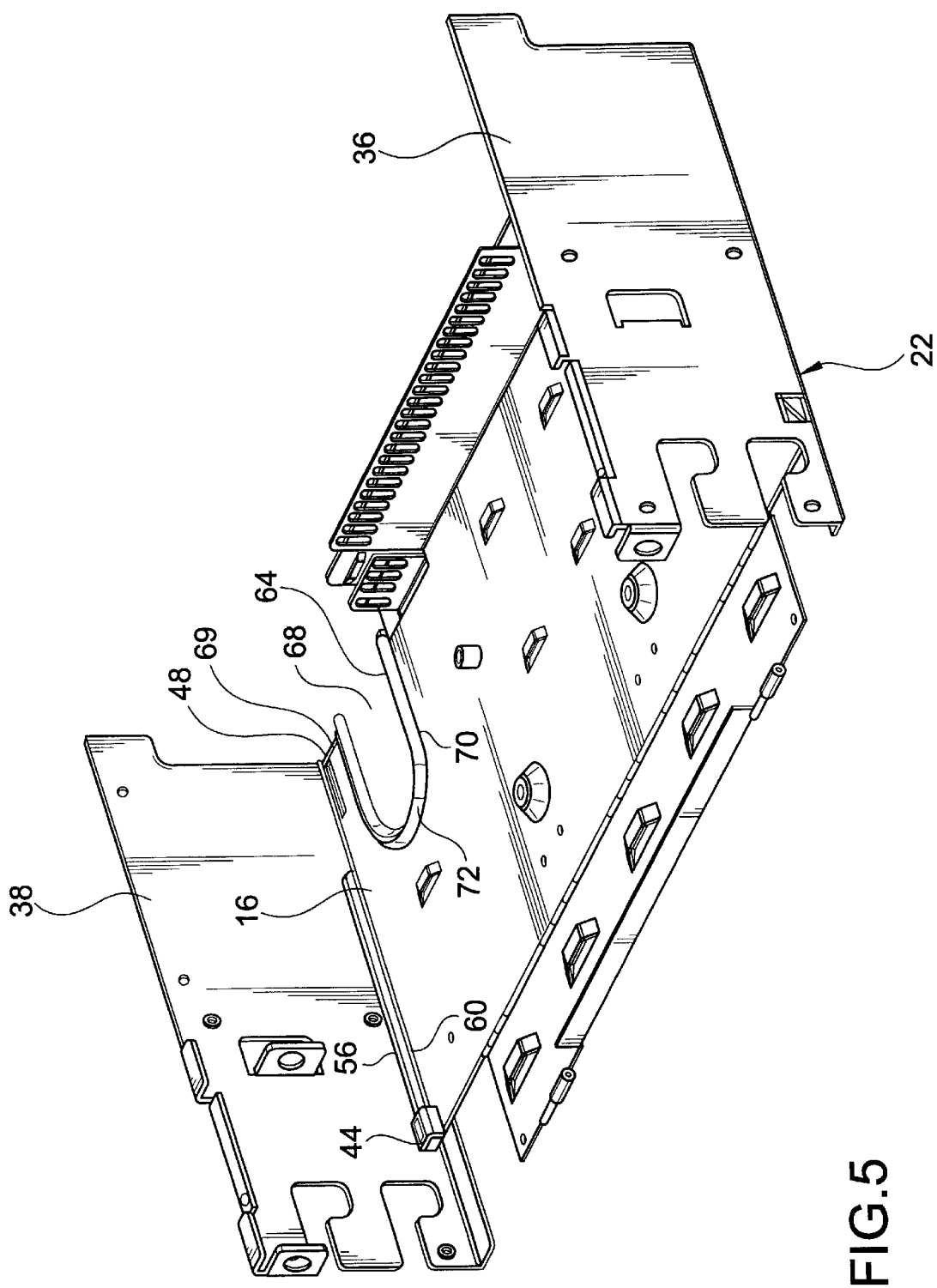
FIG. 5 is a top perspective view of the enclosure of FIG. 4 with the knock-out portion removed.

Tray 16 has lips 56 and 58 that each extends from an edge 60 and 62, respectively. Each lip 56 and 58 is preferably a small edge that extends substantially the entire length of the respective edge, away from surface 14 and substantially perpendicular from tray 16. However, each lip can extend along a portion of its respective edge and at any suitable angle from tray 16. Each lip fits with a respective bracket 44 (FIG. 7) and together the brackets and lips allow the tray to slide back and forth relative to surface 14 (FIGS. 2 and 4). Tray 16 preferably has an open position and a closed position. The open position is when the tray is moved so that through passageway 64 does not overlie through passageway 12, as seen in FIGS. 2 and 3. The closed position is when the tray is moved so that through passageway 64 overlies through passageway 12, as seen in FIGS. 4–6.

Passageway 64 preferably has a U-shaped knock-out portion 66 attached or coupled thereto. When tray 16 is moved into the closed position, knock-out portion 66 overlies and substantially covers cable passageway 12. Knock-out portion 66 serves as a dust gasket to reduce or eliminate dust and dirt from entering the enclosure when tray 16 is in the closed position, but can be easily removed to allow a cable to be passed therethrough and into the enclosure 10. As seen specifically in FIG. 8, knock-out portion 66 and tray 16 do not extend completely to the free end 48 of surface 14. However, knock-out portion 66 can extend any length desired, including to the free end of surface 14.

Knock-out portion 66 is preferably releasably attached to edge 70 of passageway 64 in any manner desirable, such as having a relatively thin portion of metal between the knock-out portion and the edge 70 of the passageway. Preferably, knock-out portion 66 can be removed by hand; but may be removed by any desired tool or other device. Edge 70 preferably has a flared portion 72, which extends substantially the entire length of edge 70 and away from surface 14 or passageway 12, but can extend along only a portion of edge 70. As seen specifically in FIGS. 7 and 8, flared portion 72 preferably extends inwardly toward the center of through passageway 64; however, portion 72 may extend in any direction desired.

As seen in 3, 4, 7 and 8, through passageway 64 is substantially the same shape and orientation as passageway 12, but is slightly larger, as illustrated in FIGS. 6 and 7, for resting of flared portion 72 about rolled portion 52. In other words, passageway 64 is preferably U-shaped and has an opening 68 at a free end 69 of tray 16. When tray 16 is moved into the closed position passageway 64 overlies passageway 12 and each edge of the passageways align to form one continuous U-shaped passageway from the interior enclosure 10 to the exterior of enclosure 10.

Operation

To extend a cable 18 into enclosure 10, top portion 20 can be (but does not necessarily need to be) removed and tray 16 is moved into the open position, as seen in FIGS. 2 and 3. Cable 18 is then passed through passageway 12 and into enclosure 10, as seen in FIG. 6. Cable 18 will not chafe or be damaged by the edge of the passageway, since edge 50 has a rolled portion 52 extending therefrom. In other words, when cable 18 is passed through passageway 12 it can rub against portion 52, in either direction, and it will not be damaged. Knock-out portion 66 is then removed from passageway 64 by hand or any tool desired, and tray 16 is moved into the closed position. When tray 16 is in a closed position, the rolled portion 52 extends in-between surface 14 and the flared edge of passageway 64. As seen in FIGS. 7 and 8, the flared edge would also allow cable 18 to be inserted into the enclosure 10 without damaging the cable 18. Once the cable is inserted, cable 18 can be coupled to the electrical device as is known in the art and top portion 20 can be coupled to bottom portion 22. Enclosure 10 can then be mounted to a rack or any other mechanism desired.

It is noted that it is not necessary to follow the specific order of steps to assemble or operate the present invention described above. The order may be changed or altered in any manner desired; for example, the knock-out portion can be removed before the cable is inserted into the enclosure or before the tray is even moved.

While a particular embodiment has been chosen to illustrate the invention, it will be understood by those skilled in the art that various changes and modifications can be made therein without departing from the scope of the invention as defined in the appended claims.

What is claimed is:

1. An enclosure for an electrical device, comprising:
   a first wall portion having a first cable through passageway with an edge, a portion of said edge being rolled and having a substantially U-shaped cross-section; and
   a second wall portion adjacent said first portion and having a removable knock-out portion at least partially covering a second cable through passageway.
2. An enclosure according to claim 1, wherein
   said rolled portion extends along substantially all of said edge.
3. An enclosure according to claim 1, wherein
   said first and second cable through passageways comprise a substantially U-shaped opening at a free end of said first and second wall portions, respectively.
4. An enclosure according to claim 3, wherein
   said knock-out portion is substantially U-shaped and is adapted to be positioned to cover said second U-shaped passageway.
5. An enclosure according to claim 1, wherein
   said second cable passageway has an second edge and said knock out portion is releasably coupled to said second edge.
6. An enclosure according to claim 1, wherein
   said second cable passageway has a flared edge.
7. An enclosure according to claim 6, wherein
   said flared edge extends away from said first portion and said first and second wall portions overlie.
8. An enclosure according to claim 6, wherein
   said second portion is a tray that is coupled to said enclosure and can move relative to said first portion.
9. An enclosure according to claim 8, wherein
   said rolled portion extends in-between said first wall portion and said flared edge when said second wall portion is in a closed position.
10. An enclosure according to claim 1, wherein
    said first and second cable through passageways are open ended U-shaped through passageways and are substantially alignable with one another.
11. An enclosure according to claim 1, wherein
    said first wall portion forms a wall of the enclosure device.
12. An enclosure for routing a cable to an electrical device, comprising:
    a wall having a first substantially U-shaped cable entry slot, said entry slot having a first edge, substantially all of said first edge being rolled;
    a tray adjacent and overlying said wall and movable relative thereto, said tray having a second substantially U-shaped cable entry slot with a second edge, a portion of said second edge being flared.
13. An enclosure according to claim 12, wherein
    said first edge extends in-between said wall and second edge of said tray when said tray is in a closed position.
14. An enclosure according to claim 13, wherein
    said first edge has a substantially U-shaped cross-section.
15. An enclosure according to claim 12, further comprising
    a knock out portion at least partially covering said second entry slot, said knock-out portion being substantially U-shaped.
16. An enclosure according to claim 12, wherein
    said second edge extends away from said enclosure device.
17. A system according to claim 12, wherein
    said first and second entry slots are open ended U-shaped through passageways and are substantially aligned with one another.
18. A system according to claim 12, wherein
    said tray is coupled to said enclosure.
19. A method for routing a cable through an enclosure device, the enclosure device having a wall with a first substantially U-shaped entry slot, the first entry slot having a first edge, substantially all of the first edge being rolled, and a tray adjacent the wall with a second substantially U-shaped entry slot, the tray having a second edge, a portion of said second edge being flared, the method comprising the steps of
    moving said tray so that the first and second entry slots are substantially aligned,
    removing a knock-out portion that at least partially covers the second U-shaped entry slot,
    inserting a cable though the first entry slot in the wall of the enclosure device, and
    inserting the cable though the second entry slot in the tray.
20. An enclosure for an electrical device, comprising:
    a first wall portion having a first cable through passageway with an edge, a portion of said edge being rolled; and
    a second wall portion adjacent and overlying said first portion and having a removable knock-out portion at least partially covering a second cable through passageway, said second cable passageway having a flared edge that extends away from said first portion.
21. An enclosure according to claim 20, wherein
    said rolled portion extends along substantially all of said edge.

22. An enclosure according to claim 20, wherein said rolled portion has a substantially U-shaped cross-section.

23. An enclosure according to claim 20, wherein said first and second cable through passageways comprise a substantially U-shaped opening at a free end of said first and second wall portions, respectively.

24. An enclosure according to claim 23, wherein said knock-out portion is substantially U-shaped and is adapted to be positioned to cover said second U-shaped passageway.

25. An enclosure according to claim 20, wherein said second cable passageway has a second edge and said knock out portion is releasably coupled to said second edge.

26. An enclosure according to claim 20, wherein said second portion is a tray that is coupled to said enclosure and can move relative to said first portion.

27. An enclosure according to claim 20, wherein said rolled portion extends in-between said first wall portion and said flared edge when said second wall portion is in a closed position.

28. An enclosure according to claim 20, wherein said first and second cable through passageways are open ended U-shaped through passageways and are substantially alignable with one another.

29. An enclosure according to claim 20, wherein said first wall portion forms a wall of the enclosure device.

30. An enclosure for an electrical device, comprising:
a first wall portion having a first cable through passageway with an edge, a portion of said edge being rolled; and
a tray adjacent said first portion having a removable knock-out portion at least partially covering a second cable through passageway, said tray being coupled to said enclosure and being able to move relative to said first portion.

31. An enclosure according to claim 30, wherein said rolled portion extends along substantially all of said edge.

32. An enclosure according to claim 30, wherein said rolled portion has a substantially U-shaped cross-section.

33. An enclosure according to claim 30, wherein said first and second cable through passageways comprise a substantially U-shaped opening at a free end of said first wall portion and said tray, respectively.

34. An enclosure according to claim 33, wherein said knock-out portion is substantially U-shaped and is adapted to be positioned to cover said second U-shaped passageway.

35. An enclosure according to claim 30, wherein said second cable passageway has a second edge and said knock out portion is releasably coupled to said second edge.

36. An enclosure according to claim 30, wherein said flared edge extends away from said first portion and said first wall portion and said tray overlie.

37. An enclosure according to claim 30, wherein said rolled portion extends in-between said first wall portion and said flared edge when said tray is in a closed position.

38. An enclosure according to claim 30, wherein said first and second cable through passageways are open ended U-shaped through passageways and are substantially alignable with one another.

39. An enclosure according to claim 30, wherein said first wall portion forms a wall of the enclosure device.

40. An enclosure for an electrical device, comprising:
a first wall portion having a first cable through passageway with an edge, a portion of said edge being rolled; and
a second wall portion substantially parallel and adjacent said first portion and having a removable knock-out portion at least partially covering a second cable through passageway.

41. An enclosure according to claim 40, wherein said rolled portion extends along substantially all of said edge.

42. An enclosure according to claim 40, wherein said rolled portion has a substantially U-shaped cross-section.

43. An enclosure according to claim 40, wherein said first and second cable through passageways comprise a substantially U-shaped opening at a free end of said first and second wall portions, respectively.

44. An enclosure according to claim 43, wherein said knock-out portion is substantially U-shaped and is adapted to be positioned to cover said second U-shaped passageway.

45. An enclosure according to claim 40, wherein said second cable passageway has a second edge and said knock out portion is releasably coupled to said second edge.

46. An enclosure according to claim 40, wherein said second cable passageway has a flared edge.

47. An enclosure according to claim 46, wherein said flared edge extends away from said first portion and said first and second wall portions overlie.

48. An enclosure according to claim 46, wherein said second portion is a tray that is coupled to said enclosure and can move relative to said first portion.

49. An enclosure according to claim 48, wherein said rolled portion extends in-between said first wall portion and said flared edge when said second wall portion is in a closed position.

50. An enclosure according to claim 40, wherein said first and second cable through passageways are open ended U-shaped through passageways and are substantially alignable with one another.

51. An enclosure according to claim 40, wherein said first wall portion forms a wall of the enclosure device.

52. An enclosure for an electrical device, comprising:
a first wall portion having a first cable through passageway with an edge, a portion of said edge being rolled and curving backwardly toward said first wall portion; and
a second wall portion adjacent said first portion and having a removable knock-out portion at least partially covering a second cable through passageway.

53. An enclosure according to claim 52, wherein said rolled portion extends along substantially all of said edge.

54. An enclosure according to claim 52, wherein said rolled portion has a substantially U-shaped cross-section.

55. An enclosure according to claim 52, wherein said first and second cable through passageways comprise a substantially U-shaped opening at a free end of said first and second wall portions, respectively.

56. An enclosure according to claim 55, wherein said knock-out portion is substantially U-shaped and is adapted to be positioned to cover said second U-shaped passageway.

57. An enclosure according to claim 52, wherein said second cable passageway has a second edge and said knock out portion is releasably coupled to said second edge.

58. An enclosure according to claim 52, wherein said second cable passageway has a flared edge.

59. An enclosure according to claim 58, wherein said flared edge extends away from said first portion and said first and second wall portions overlie.

60. An enclosure according to claim 58, wherein said second portion is a tray that is coupled to said enclosure and can move relative to said first portion.

61. An enclosure according to claim 60, wherein said rolled portion extends in-between said first wall portion and said flared edge when said second wall portion is in a closed position.

62. An enclosure according to claim 52, wherein said first and second cable through passageways are open ended U-shaped through passageways and are substantially alignable with one another.

63. An enclosure according to claim 52, wherein said first wall portion forms a wall of the enclosure device.

* * * * *